(12) United States Patent
Ohya et al.

(10) Patent No.: US 9,634,188 B2
(45) Date of Patent: Apr. 25, 2017

(54) LED ELEMENT

(71) Applicant: EL-SEED CORPORATION, Nagoya-shi (JP)

(72) Inventors: Masaki Ohya, Nagoya (JP); Koichi Naniwae, Nagoya (JP); Atsushi Suzuki, Nagoya (JP); Toshiyuki Kondo, Nagoya (JP); Midori Mori, Nagoya (JP)

(73) Assignee: EL-SEED CORPORATION, Nagoya-Shi, Aichi (JP)

( * ) Notice: Subject to any disclaimer, the term of this patent is extended or adjusted under 35 U.S.C. 154(b) by 0 days.

(21) Appl. No.: 14/894,509

(22) PCT Filed: May 19, 2014

(86) PCT No.: PCT/JP2014/063168
§ 371 (c)(1),
(2) Date: Nov. 28, 2015

(87) PCT Pub. No.: WO2015/083386
PCT Pub. Date: Jun. 11, 2015

(65) Prior Publication Data
US 2016/0111599 A1    Apr. 21, 2016

(30) Foreign Application Priority Data
Dec. 3, 2013    (JP) .................. 2013-249989

(51) Int. Cl.
*H01L 29/49* (2006.01)
*H01L 33/22* (2010.01)
(Continued)

(52) U.S. Cl.
CPC .............. *H01L 33/22* (2013.01); *H01L 33/10* (2013.01); *H01L 33/32* (2013.01); *H01L 2933/0083* (2013.01)

(58) Field of Classification Search
CPC ......... H01L 33/12; H01L 33/20; H01L 33/22; H01L 33/40; H01L 33/405; H01L 33/58; H01L 33/60
See application file for complete search history.

(56) References Cited

U.S. PATENT DOCUMENTS 8,957,402 B2 *   2/2015   Kojima ................... H01L 33/22
                                                    257/13
8,963,177 B2 *   2/2015   Katsuno .................. H01L 33/46
                                                    257/98

(Continued)

FOREIGN PATENT DOCUMENTS

JP    H 09-64421 A      3/1997
WO   WO 2011/027679 A1  3/2011

OTHER PUBLICATIONS

International Search Report (ISR) (PCT Form PCT/ISA/210), in PCT/JP2014/063168, dated Aug. 26, 2014.

(Continued)

*Primary Examiner* — Michael Shingleton
(74) *Attorney, Agent, or Firm* — McGinn IP Law Group, PLLC

(57) ABSTRACT

In order to achieve appropriate light distribution using light distribution characteristics resulting from diffraction while improving light extraction efficiency using a diffraction effect, an LED element provided with: a substrate in which periodic depressions or projections are formed on a front surface; a semiconductor laminated part that is formed on the front surface of the sapphire substrate, includes a light-emitting layer, and is formed of a group-III nitride semi-conductor; and a reflecting part that reflects at least a part of light emitted from the light-emitting layer toward the front surface of the substrate, the LED element obtaining a diffraction effect of light emitted from the light-emitting layer at an interface between the substrate and the semicon- (Continued)

ductor laminated part, wherein a relation of $1/2 \times \lambda \leq P \leq 16/9 \times \lambda$ is satisfied, where a period of the depressions or the projections is P and a peak wavelength of the light emitted from the light-emitting layer is $\lambda$.

13 Claims, 19 Drawing Sheets

(51) Int. Cl.
   *H01L 33/10*     (2010.01)
   *H01L 33/32*     (2010.01)

(56) References Cited

U.S. PATENT DOCUMENTS

| | | | | |
|---|---|---|---|---|
| 9,214,605 | B2* | 12/2015 | Tanaka | H01L 33/382 |
| 2010/0120183 | A1* | 5/2010 | Kim | H01L 33/0079 |
| | | | | 438/29 |
| 2011/0049550 | A1* | 3/2011 | Katsuno | H01L 33/405 |
| | | | | 257/98 |
| 2011/0220934 | A1* | 9/2011 | Gotoda | H01L 33/0079 |
| | | | | 257/98 |
| 2012/0228656 | A1* | 9/2012 | Kamiyama | H01L 33/22 |
| | | | | 257/98 |
| 2013/0056770 | A1* | 3/2013 | Shatalov | H01L 21/0237 |
| | | | | 257/94 |
| 2013/0140592 | A1* | 6/2013 | Lee | H01L 33/0095 |
| | | | | 257/98 |
| 2015/0280065 | A1* | 10/2015 | Wada | H01L 33/22 |
| | | | | 257/98 |
| 2015/0295154 | A1* | 10/2015 | Tu | H01L 33/0079 |
| | | | | 438/27 |
| 2015/0349202 | A1* | 12/2015 | Yamamoto | H01L 33/02 |
| | | | | 257/98 |
| 2016/0111599 | A1* | 4/2016 | Ohya | H01L 33/10 |
| | | | | 257/98 |
| 2016/0163925 | A1* | 6/2016 | Jo | H01L 33/22 |
| | | | | 257/76 |

OTHER PUBLICATIONS

Notification of Reason(s) for refusal dated Jan. 30, 2014 (an office action of related Japanese application No. 2013-249989), and its English translation.

* cited by examiner

F I G. 5
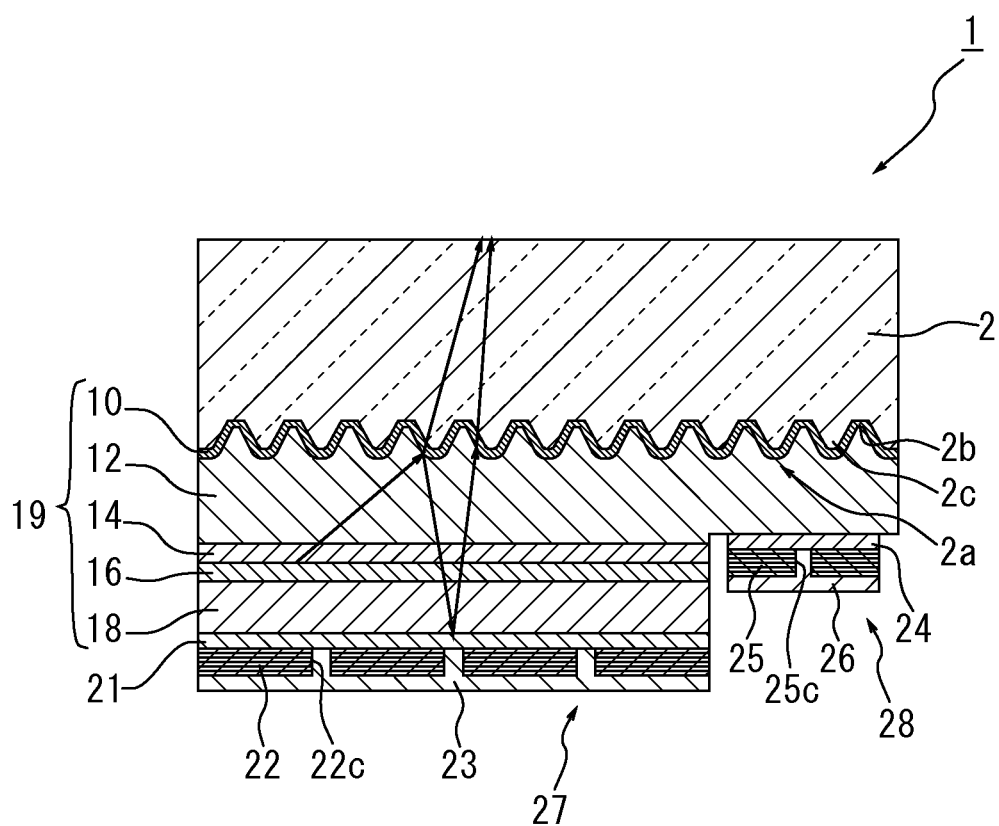

F I G. 8
(a)
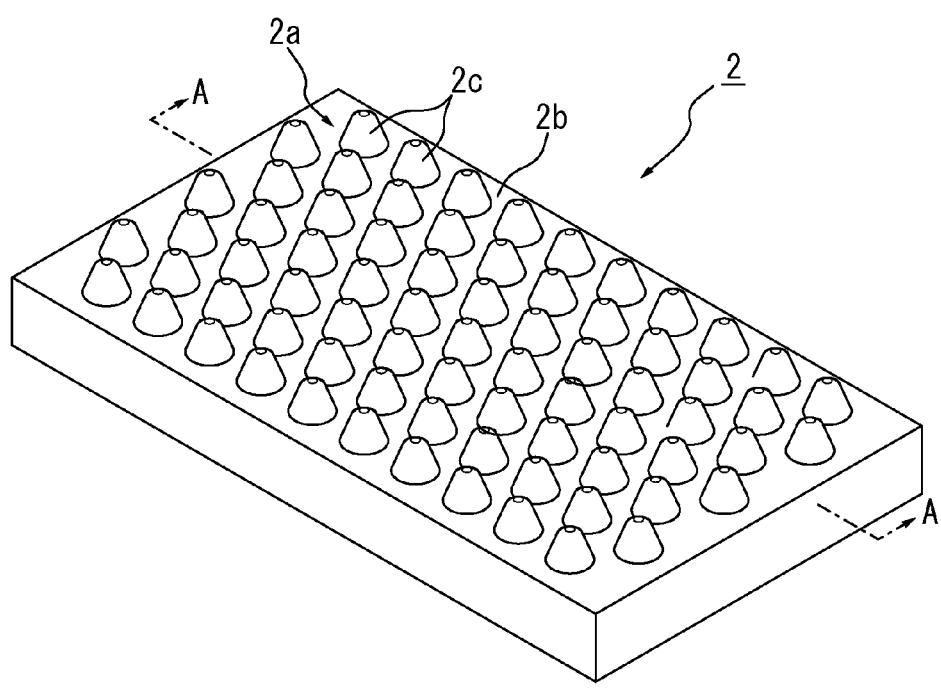
(b)
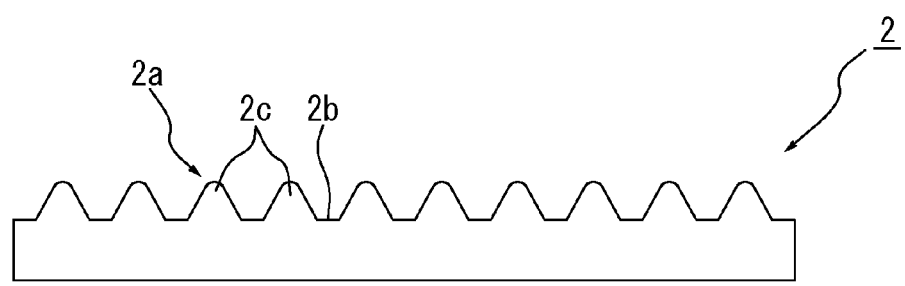

FIG. 9
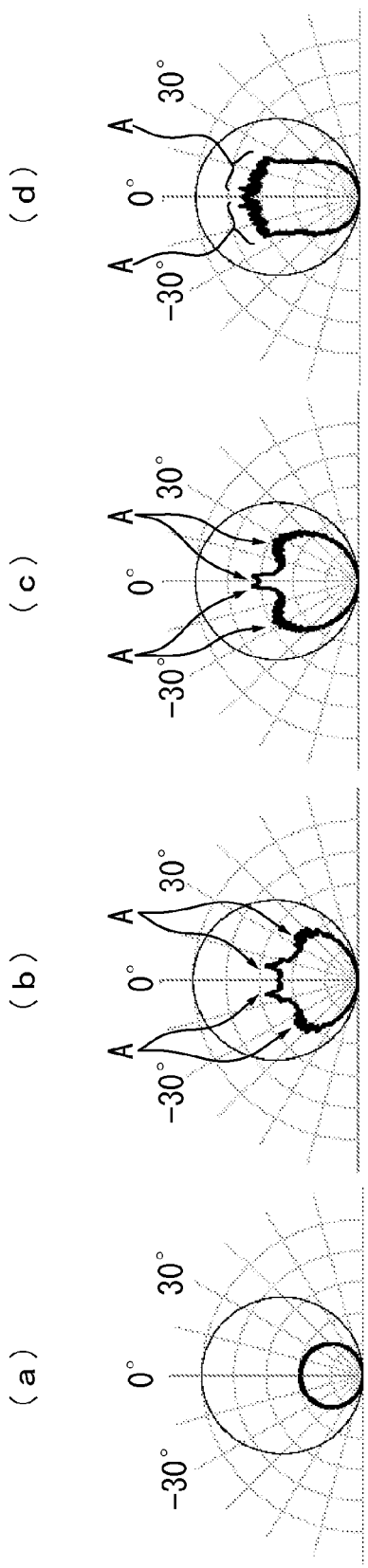
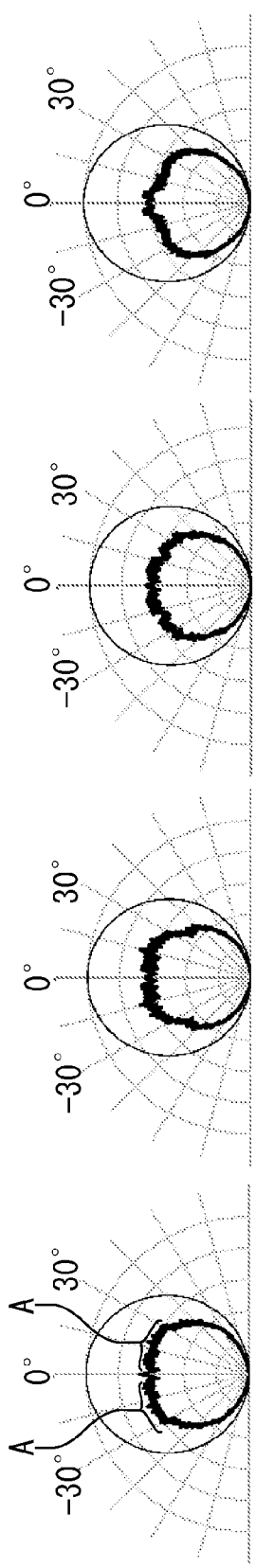

F I G. 1 0

|  | FSS | PSS | MPSS |
|---|---|---|---|
| CALCULATION VALUE (ARBITRARY UNIT) | 0.50 | 0.49 | 0.55 |
| MEASUREMENT VALUE (ARBITRARY UNIT) | 0.51 | 0.47 | 0.55 |

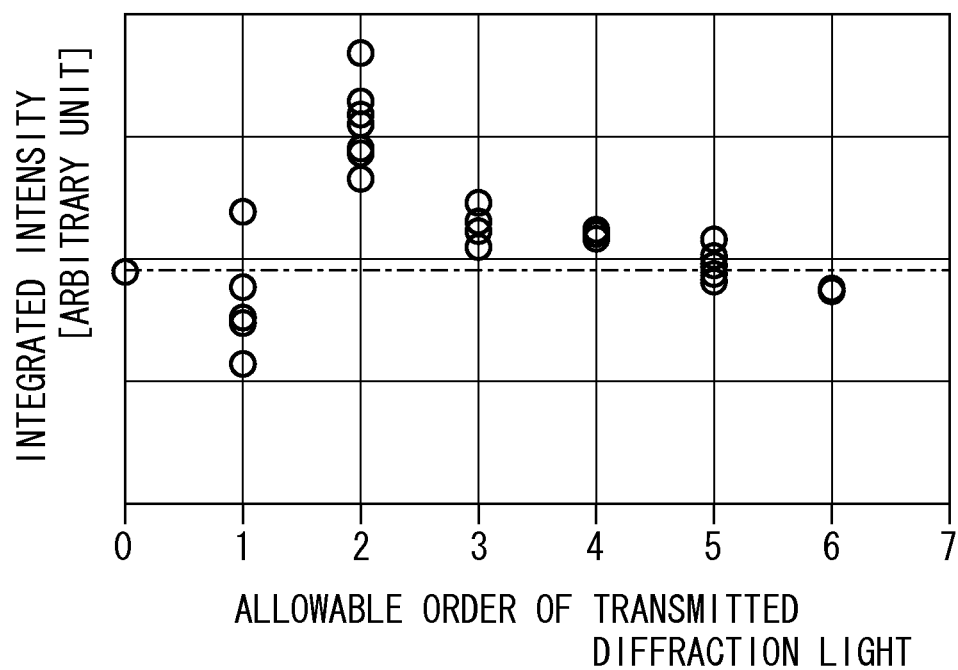
F I G. 1 2

F I G. 16
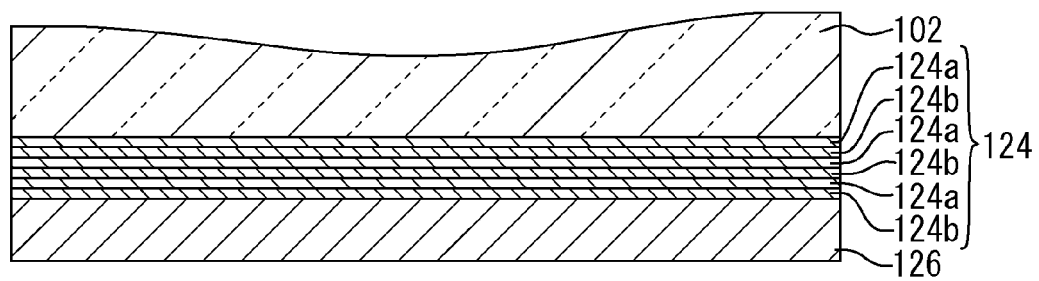

LED ELEMENT

TECHNICAL FIELD

The present invention relates to an LED element.

BACKGROUND ART

An LED element including a group-III nitride semiconductor that is formed on the front surface of a sapphire substrate and includes a light-emitting layer, a diffractive surface that is formed on the front surface of the sapphire substrate so that light emitted from the light-emitting layer is incident thereon and has depressions or projections whose period is larger than an optical wavelength of the light and is smaller than the coherence length of the light, and an Al reflective film that is formed on a back surface of the substrate so as to reflect the light diffracted by the diffractive surface so that the light is incident on the diffractive surface again is known (see Patent Literature 1). With this LED element, light transmitted by the diffraction effect is incident on the diffractive surface again and is transmitted through the diffractive surface again by the diffraction effect, whereby the light can be extracted outside the element in a plurality of modes.

CITATION LIST

Patent Literature

Patent Literature 1: WO2011/027679

SUMMARY OF INVENTION

Technical Problem

However, it is not known which light distribution characteristics are obtained when light is extracted using the diffraction effect.

The present invention is made in view of the above-described circumstances, and its object is to provide an LED element capable of realizing appropriate light distribution using the light distribution characteristics resulting from diffraction while improving the light extraction efficiency using the diffraction effect.

Solution to Problem

In order to achieve the above-described object, the present invention provides an LED element including: a substrate in which periodic depressions or projections are formed on a front surface; a semiconductor laminated part that is formed on the front surface of the substrate and includes a light-emitting layer; and a reflecting part that reflects at least a part of light emitted from the light-emitting layer toward the front surface of the substrate, wherein a diffraction effect of light emitted from the light-emitting layer is obtained at an interface between the substrate and the semiconductor laminated part, and a relation of $1/2 \times \lambda \leq P \leq 16/9 \times \lambda$ is satisfied, where a period of the depressions or the projections is P and a peak wavelength of the light emitted from the light-emitting layer is $\lambda$.

In the LED element, it is preferable that, a relation of $23/45 \times \lambda \leq P \leq 14/9 \times \lambda$ is satisfied, where a period of the depressions or the projections is P and a peak wavelength of the light emitted from the light-emitting layer is $\lambda$.

In the LED element, it is preferable that a period of the depressions or the projections is set such that transmitted diffraction light of the light at the interface includes at least second-order diffraction light and does not include fifth-order diffraction light.

In the LED element, it is preferable that a period of the depressions or the projections is set such that reflected diffraction light of the light at the interface includes at least third-order diffraction light.

In the LED element, it is preferable that the reflectivity of the reflecting part increases as an angle comes closer to the direction vertical to the interface.

Moreover, the present invention provides an LED element including: a sapphire substrate in which periodic depressions or projections are formed on a front surface and the front surface forms a diffractive surface; a semiconductor laminated part that is formed on the front surface of the sapphire substrate, includes a light-emitting layer, and is formed of a group-III nitride semiconductor; and a reflecting part that reflects at least a part of light emitted from the light-emitting layer toward the front surface of the sapphire substrate, wherein a diffraction effect of light emitted from the light-emitting layer is obtained at an interface between the sapphire substrate and the semiconductor laminated part; an intensity distribution of the light transmitting through and extracted from the diffractive surface close to the sapphire substrate is inclined closer to a direction vertical to the interface between the semiconductor laminated part and the sapphire substrate than an intensity distribution of the light incident on the diffractive surface close to the semiconductor laminated part, and a relation of $1/2 \times \lambda \leq P \leq 16/9 \times \lambda$ is satisfied, where a period of the depressions or the projections is P and a peak wavelength of the light emitted from the light-emitting layer is $\lambda$, and the reflectivity of the reflecting part increases as an angle comes closer to the direction vertical to the interface.

Further, the present invention provides an LED element including: a sapphire substrate in which periodic depressions or projections are formed on a front surface and the front surface forms a diffractive surface; a semiconductor laminated part that is formed on the front surface of the sapphire substrate, includes a light-emitting layer, and is formed of a group-III nitride semiconductor; and a reflecting part that reflects at least a part of light emitted from the light-emitting layer toward the front surface of the sapphire substrate, wherein a diffraction effect of light emitted from the light-emitting layer is obtained at an interface between the sapphire substrate and the semiconductor laminated part, and a relation of $1/2 \times \lambda \leq P \leq 16/9 \times \lambda$ is satisfied, where a period of the depressions or the projections is P and a peak wavelength of the light emitted from the light-emitting layer is $\lambda$, and the reflecting part is formed of a laminated structure of a dielectric multilayer film and a metal layer.

Advantageous Effects of Invention

With the LED element according to the present invention, it is possible to realize appropriate light distribution using the light distribution characteristics resulting from diffraction while improving the light extraction efficiency using the diffraction effect.

BRIEF DESCRIPTION OF DRAWINGS

FIG. 5 is an explanatory view illustrating the traveling direction of light inside the element;

FIG. 8 illustrates a sapphire substrate, in which (a) is a schematic perspective view, (b) is a schematic explanatory view taken along the A-A line;

FIG. 9 illustrates light distribution characteristics of a LED element, in which (a) illustrates a state in which projections are not formed on a sapphire substrate and (b) to (h) illustrate a state in which projections are formed on the sapphire substrate;

FIG. 10 is a table illustrating the calculation value and the measurement value of each substrate;

FIG. 12 is a graph illustrating the relation between the allowable order and the integrated intensity of transmitted diffraction light;

FIG. 16 is a partially enlarged schematic sectional view of the LED element;

DESCRIPTION OF EMBODIMENTS

Figure 1:
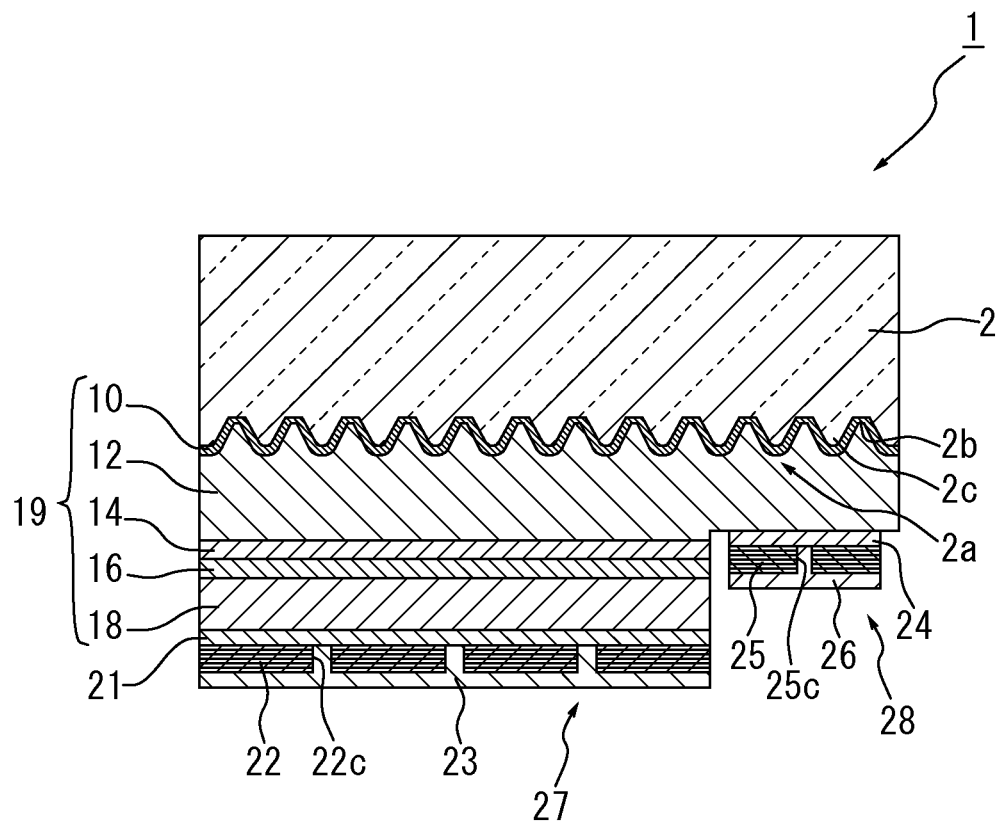
FIG. 1 is a schematic sectional view of an LED element according to a first embodiment of the present invention.

FIG. 1 is a schematic sectional view of an LED element according to a first embodiment of the present invention.

As illustrated in FIG. 1, an LED element 1 is an element in which a semiconductor laminated part 19 formed of a group-III nitride semiconductor layer is formed on a front surface of a sapphire substrate 2. Here, the index of refraction of sapphire is 1.78, and the index of refraction of the group-III nitride semiconductor layer is 2.52. This LED element 1 is a flip-chip type LED element, and light is mainly extracted from a back surface of the sapphire substrate 2. The semiconductor laminated part 19 has a buffer layer 10, an n-type GaN layer 12, a light-emitting layer 14, an electron blocking layer 16, and a p-type GaN layer 18 which are laminated in this order from the side of the sapphire substrate 2. A p-side electrode 27 is formed on the p-type GaN layer 18, and an n-side electrode 28 is formed on the n-type GaN layer 12.

As illustrated in FIG. 1, the buffer layer 10 is formed on the front surface of the sapphire substrate 2 and is formed of AlN. In the present embodiment, the buffer layer 10 is formed by an MOCVD (Metal Organic Chemical Vapor Deposition) method, but may be formed by a sputtering method. The n-type GaN layer 12 as a first conductivity-type layer is formed on the buffer layer 10 and is formed of n-GaN. The light-emitting layer 14 is formed on the n-type GaN layer 12 and is formed of GaInN/GaN and emits blue light by electron and hole injection. In the present embodiment, the peak wavelength of the light emitted from the light-emitting layer 14 is 450 nm.

The electron blocking layer 16 is formed on the light-emitting layer 14 and is formed of p-AlGaN. The p-type GaN layer 18 as a second conductivity-type layer is formed on the electron blocking layer 16 and is formed of p-GaN. The layers ranging from the n-type GaN layer 12 to the p-type GaN layer 18 are formed by epitaxial growth of the group-III nitride semiconductor. Although projections 2c are periodically formed on the front surface of the sapphire substrate 2, planarization is realized by lateral growth in the initial stage of the growth of the group-III nitride semiconductor. Moreover, the layer configuration of the semiconductor layer is optional as long as the semiconductor layer includes at least a first conductivity-type layer, an active layer, and a second conductivity-type layer, and the active layer emits light by electron-hole recombination when a voltage is applied to the first conductivity-type layer and the second conductivity-type layer.

The front surface of the sapphire substrate 2 forms a diffractive surface 2a. A planar part 2b and a plurality of projections 2c that are periodically formed on the planar part 2b are formed on the front surface of the sapphire substrate 2. Examples of the shape of each projection 2c include a pyramidal shape such as a conical shape or a polygonal pyramidal shape and a truncated pyramidal shape obtained by cutting the top of a pyramid such as a truncated conical shape or a truncated polygonal pyramidal shape. Each projection 2c is designed to diffract light emitted from the light-emitting layer 14. In the present embodiment, the light verticalizing effect can be obtained by the projections 2c disposed periodically. Here, the light verticalizing effect means an effect by which light intensity distribution after the light is reflected from and transmitted through the diffractive surface is inclined closer to the direction vertical to the interface between the sapphire substrate 2 and the semiconductor laminated part 19 than before the light is incident on the diffractive surface.

Figure 2:
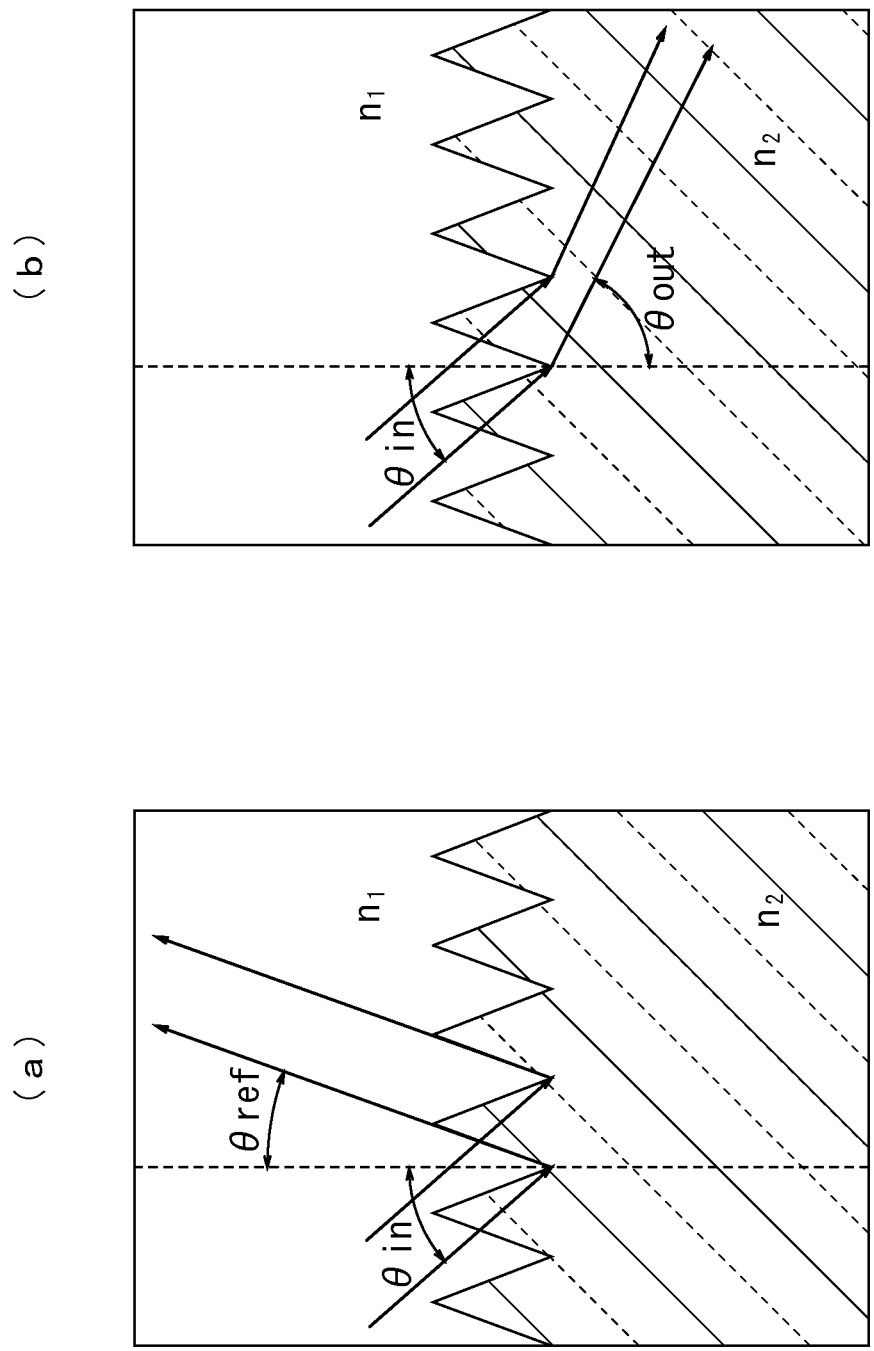
FIG. 2 is an explanatory view illustrating the diffraction effect of light at an interface between media having different indices of refraction, in which (a) illustrates a state where light is reflected from the interface, and (b) illustrates a state where light passes through the interface.

FIG. 2 is an explanatory view illustrating the diffraction effect of light at an interface between media having different indices of refraction, in which (a) illustrates a state where light is reflected from the interface, and (b) illustrates a state where light passes through the interface.

Here, from the Bragg diffraction condition, the condition to be satisfied by the angle of reflection $\theta_{ref}$ with respect to the angle of incidence $\theta_{in}$ when light is reflected from the interface is as follows.

$$P \times n_1 \times (\sin \theta_{in} - \sin \theta_{ref}) = m \times \lambda \quad (1)$$

Here, P is the period of depressions or projections, $n_1$ is an index of refraction of a medium on the incident side, $\lambda$ is a wavelength of incident light, and m is an integer. When light is incident on the sapphire substrate 2 from the semiconductor laminated part 19, $n_1$ is the index of refraction of the group-III nitride semiconductor. As illustrated in FIG. 2(a), light incident on the interface is reflected at the angle of reflection $\theta_{ref}$ that satisfies the above-described expression (1).

Meanwhile, from the Bragg diffraction condition, the condition to be satisfied by the angle of transmission $\theta_{out}$ with respect to the angle of incidence $\theta_{in}$ when light is transmitted through the interface is as follows.

$$P \times (n_1 \times \sin \theta_{in} - n_2 \times \sin \theta_{out}) = m' \times \lambda \quad (2)$$

Here, $n_2$ is an index of refraction of a medium on the output side, and m' is an integer. When, for example, light is incident on the sapphire substrate 2 from the semiconductor laminated part 19, $n_2$ is the index of refraction of sapphire. As illustrated in FIG. 2(b), the light incident on the interface is transmitted at the angle of transmission $\theta_{out}$ that satisfies the above-described expression (2).

Figure 3:
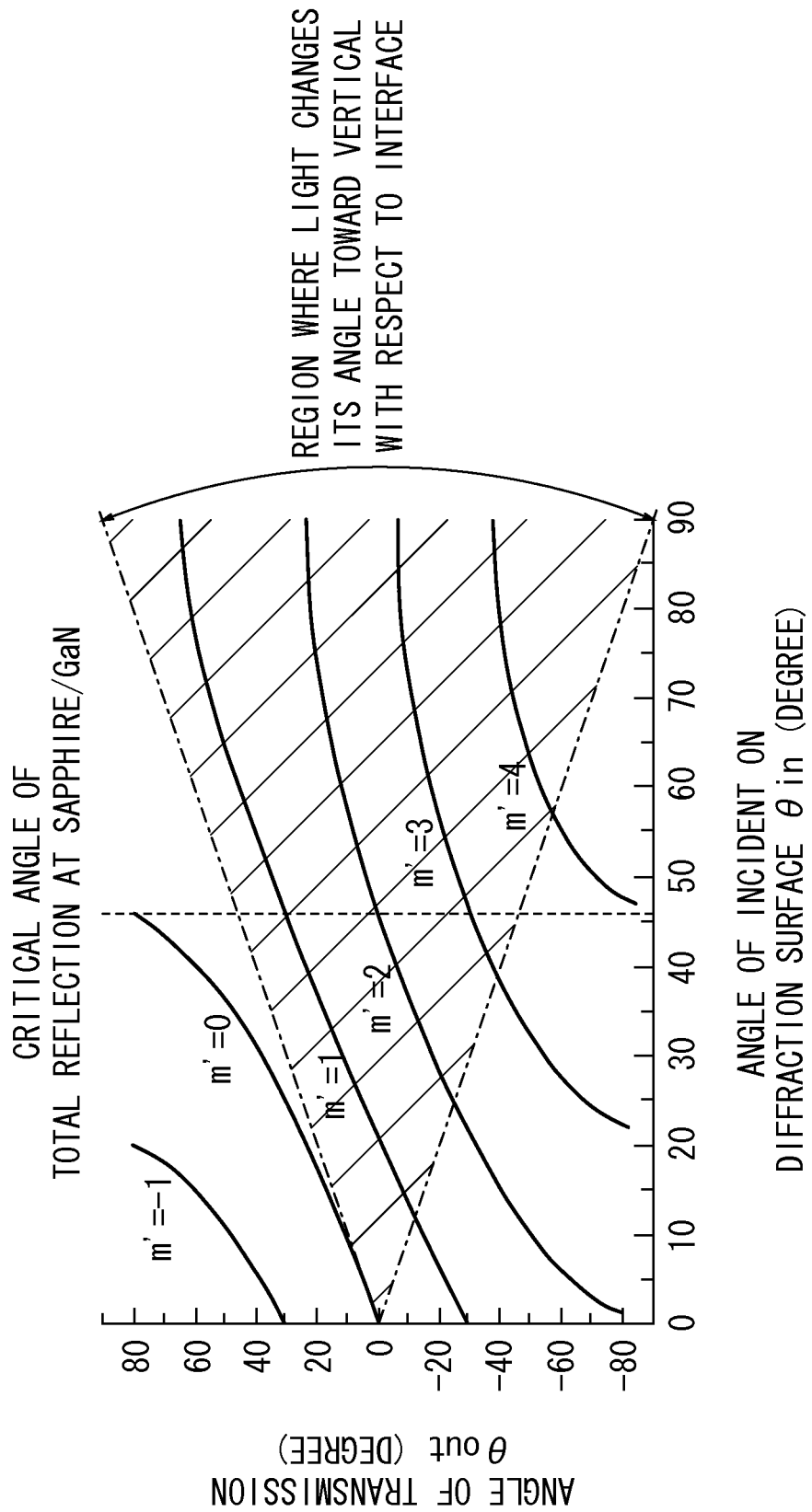
FIG. 3 is a graph illustrating the relation between the angle of incidence of light incident on an interface between a group-III nitride semiconductor layer and a sapphire substrate from the side of the semiconductor layer and the angle of transmission at the interface by the diffraction effect, when the period of depressions or projections is 500 nm.
Figure 4:
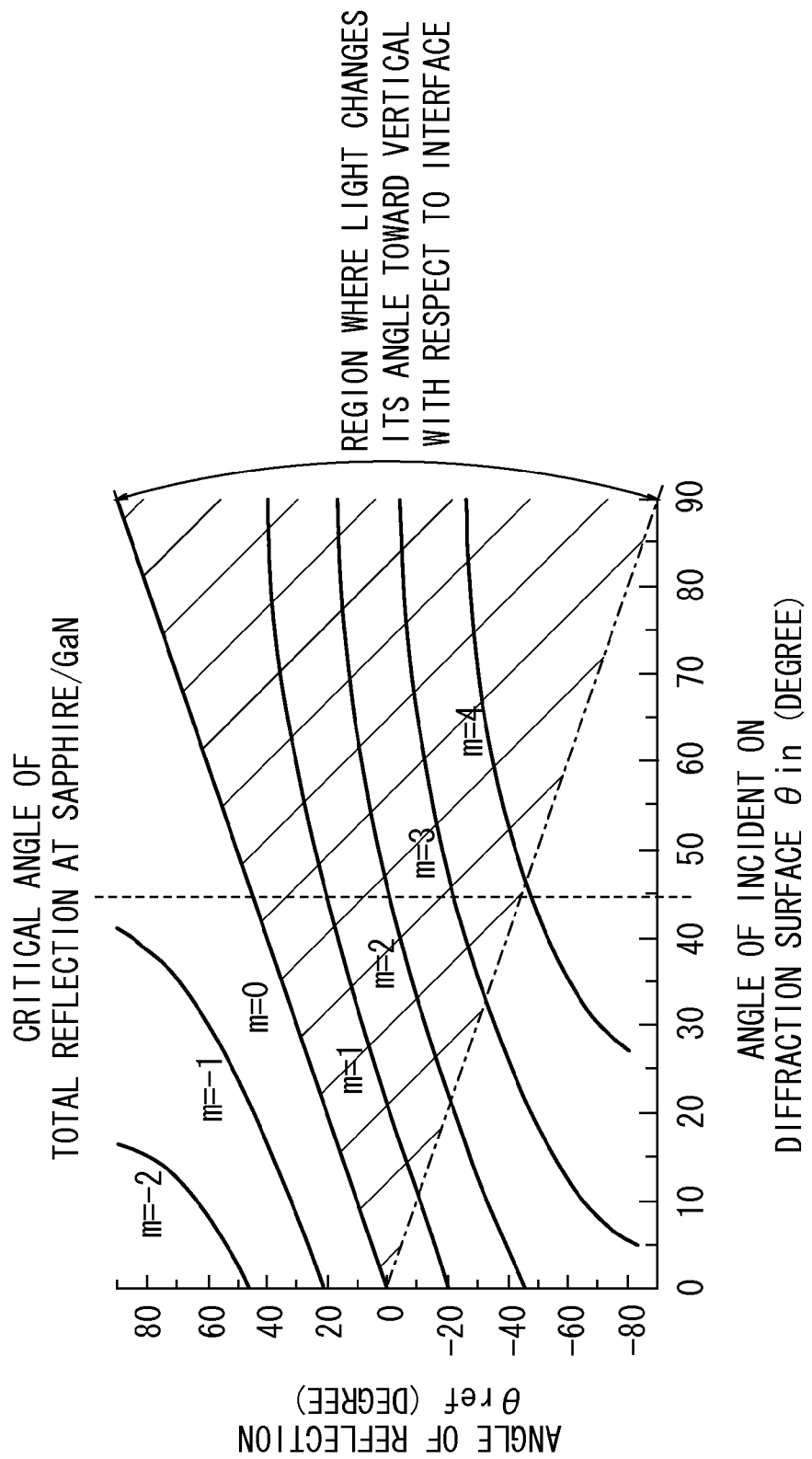
FIG. 4 is a graph illustrating the relation between the angle of incidence of light incident on the interface between the group-III nitride semiconductor layer and the sapphire substrate from the side of the semiconductor layer and the angle of reflection at the interface by the diffraction effect, when the period of depressions or projections is 500 nm.

FIG. 3 is a graph illustrating the relation between the angle of incidence of light incident on an interface between a group-III nitride semiconductor layer and a sapphire substrate from the side of the semiconductor layer and the angle of transmission at the interface by the diffraction effect, when the period of depressions or projections is 500 nm. Moreover, FIG. 4 is a graph illustrating the relation between the angle of incidence of light incident on the interface between the group-III nitride semiconductor layer and the sapphire substrate from the side of the semiconductor layer and the angle of reflection at the interface by the diffraction effect, when the period of depressions or projections is 500 nm.

As with the general flat surfaces, light incident on the diffractive surface 2a has the critical angle for total reflection. The critical angle is 45.9° at the interface between a GaN-based semiconductor layer and the sapphire substrate 2. As illustrated in FIG. 3, in the angle region exceeding the critical angle, transmission can occur in diffraction modes of m'=1, 2, 3, and 4, satisfying the diffraction condition of the above-described expression (2). Moreover, as illustrated in FIG. 4, in the angle region exceeding the critical angle, reflection can occur in diffraction modes of m=1, 2, 3, and 4, satisfying the diffraction condition of the above-described expression (1). When the critical angle is 45.9°, light output whose angle of incidence exceeds the critical angle is about 70%, and light output whose angle of incidence does not exceed the critical angle is about 30%. That is, extraction of light in the angle region exceeding the critical angle greatly contributes to improvement of light extraction efficiency of the LED element 1.

Here, in the region where the angle of transmission $\theta_{out}$ is smaller than the angle of incidence $\theta_{in}$, light that passes through the diffractive surface 2a changes its angle so as to be directed closer to the direction vertical to the interface between the sapphire substrate 2 and the group-III nitride semiconductor layer. This region is hatched in FIG. 3. As illustrated in FIG. 3, in the angle region exceeding the critical angle, light that passes through the diffractive surface 2a and that is in the diffraction modes of m'=1, 2, and 3 changes its angle so as to be directed closer to the vertical direction in all angle regions. Although the light in the diffraction mode of m'=4 does not change its angle so as to be directed closer to the vertical direction in a partial angle region, it has not so much influence as intensity of light having a larger diffraction order is relatively small, and substantially, the light also changes its angle so as to be directed closer to the vertical direction in this partial angle region. That is, the intensity distribution of the light transmitting through and extracted from the diffractive surface 2a on the side of the sapphire substrate 2 is inclined closer to the direction vertical to the interface between the semiconductor laminated part 19 and the sapphire substrate 2 than the intensity distribution of the light incident on the diffractive surface 2a on the side of the semiconductor laminated part 19.

Moreover, in the region where the angle of reflection $\theta_{ref}$ is smaller than the angle of incidence $\theta_{in}$, light that is reflected from the diffractive surface 2a changes its angle so as to be directed closer to the direction vertical to the interface between the sapphire substrate 2 and the group-III nitride semiconductor layer. This region is hatched in FIG. 4. As illustrated in FIG. 4, in the angle region exceeding the critical angle, light that is reflected from the diffractive surface 2a and that is in the diffraction modes of m=1, 2, and 3 changes its angle so as to be directed closer to the vertical direction in all angle regions. Although the light in the diffraction mode of m=4 does not change its angle so as to be directed closer to the vertical direction in a partial angle region, it has not so much influence as intensity of light having a larger diffraction order is relatively small, and substantially, the light also changes its angle so as to be directed closer to the vertical direction in this partial angle region. That is, the intensity distribution of the light extracted, by reflection, from the diffractive surface 2a on the semiconductor laminated part 19 is inclined closer to the direction vertical to the interface between the semiconductor laminated part 19 and the sapphire substrate 2 than the intensity distribution of the light incident on the diffractive surface 2a on the side of the semiconductor laminated part 19.

FIG. 5 is an explanatory view illustrating the traveling direction of light inside the element.

As illustrated in FIG. 5, light incident on the sapphire substrate 2 at an angle exceeding the critical angle among the light emitted from the light-emitting layer 14 is transmitted through and reflected from the diffractive surface 2a so as to be directed closer to the vertical direction than when the light is incident on the diffractive surface 2a. That is, light having transmitted through the diffractive surface 2a is incident on the back surface of the sapphire substrate 2 in a state where its angle is changed so as to be directed closer to the vertical direction. Moreover, light having been reflected from the diffractive surface 2a is incident on the diffractive surface 2a again after being reflected from the p-side electrode 27 and the n-side electrode 28 in a state where its angle is changed so as to be directed closer to the vertical direction. The angle of incidence at this time is closer to the vertical direction than the previous angle of incidence. As a result, light can be incident closer to the vertical direction on the back surface of the sapphire substrate 2.

Figure 6:
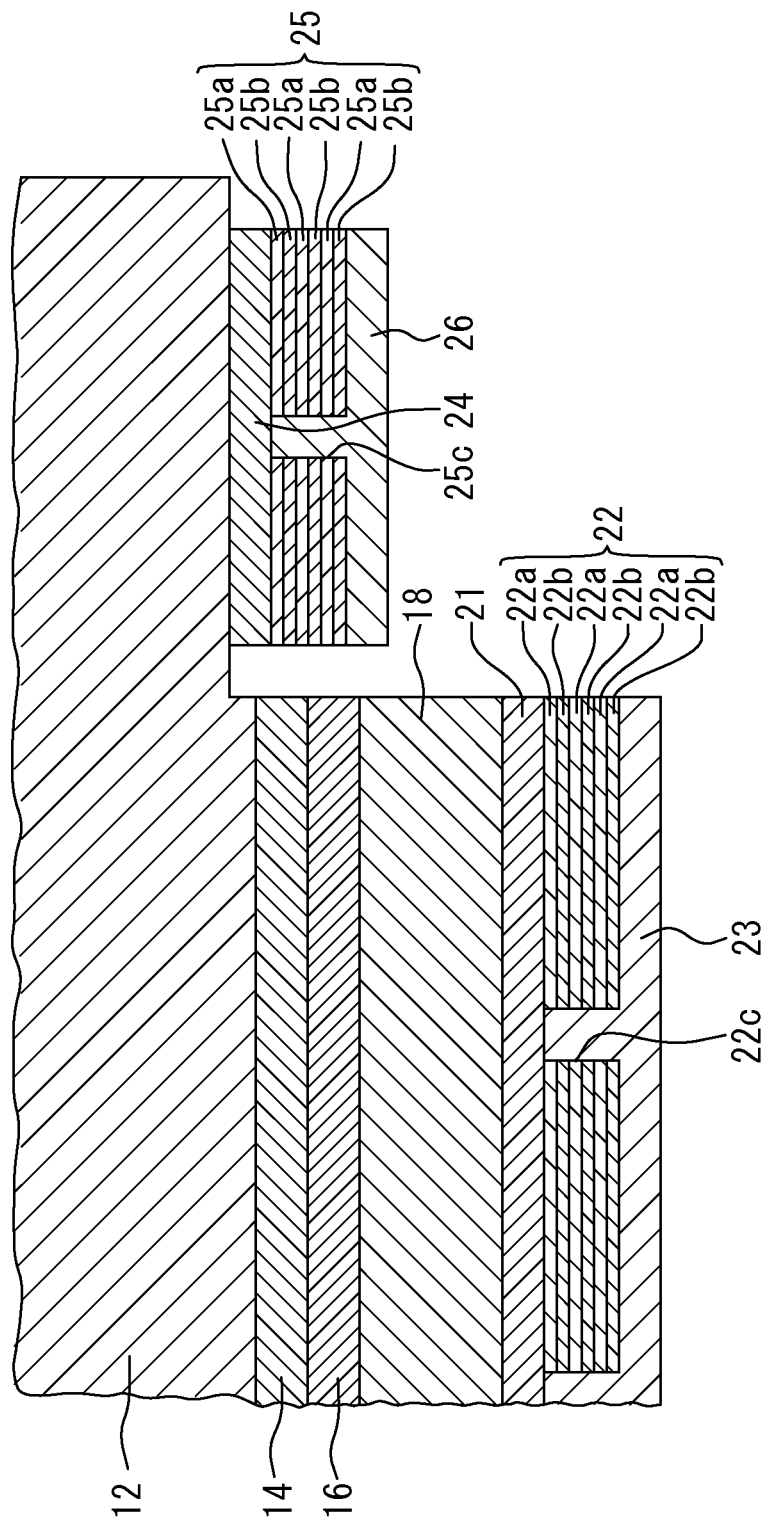
FIG. 6 is a partially enlarged schematic sectional view of the LED element.

FIG. 6 is a partially enlarged schematic sectional view of the LED element.

As illustrated in FIG. 6, the p-side electrode 27 includes a diffusion electrode 21 that is formed on the p-type GaN layer 18, a dielectric multilayer film 22 that is formed on a predetermined region on the diffusion electrode 21, and a metal electrode 23 that is formed on the dielectric multilayer film 22. The diffusion electrode 21 is formed on the entire surface of the p-type GaN layer 18 and is formed of a transparent material such as ITO (Indium Tin Oxide), for example. The dielectric multilayer film 22 is formed by repeatedly laminating a plurality of pairs of a first material 22a and a second material 22b having different indices of refraction. For example, the dielectric multilayer film 22 may have five pairs of the first material 22a of $ZrO_2$ (index of refraction 2.18) and the second material 22b of $SiO_2$ (index of refraction 1.46). It should be noted that materials other than $ZrO_2$ and $SiO_2$ may be used to form the dielectric multilayer film 22, and MN (index of refraction 2.18), $Nb_2O_3$ (index of refraction 2.4), $Ta_2O_3$ (index of refraction 2.35) or the like may be used, for example. The metal electrode 23 covers the dielectric multilayer film 22 and is formed of a metal material such as Al, for example. The metal electrode 23 is electrically connected to the diffusion electrode 21 through a via-hole 22c formed in the dielectric multilayer film 22.

As illustrated in FIG. 6, the n-side electrode 28 is formed on the n-type GaN layer 12 exposed after etching the p-type GaN layer 18 to form the n-type GaN layer 12. The n-side electrode 28 includes a diffusion electrode 24 that is formed on the n-type GaN layer 12, a dielectric multilayer film 25 that is formed on a predetermined region of the diffusion electrode 24, and a metal electrode 26 that is formed on the dielectric multilayer film 25. The diffusion electrode 24 is formed on the entire surface of the n-type GaN layer 12 and is formed of a transparent material such as ITO (Indium Tin Oxide), for example. The dielectric multilayer film 25 is formed by repeatedly laminating a plurality of pairs of a first material 25a and a second material 25b, having different indices of refraction. For example, the dielectric multilayer film 25 may have five pairs of the first material 25a of $ZrO_2$ (index of refraction 2.18) and the second material 25b of $SiO_2$ (index of refraction 1.46). It should be noted that materials other than $ZrO_2$ and $SiO_2$ may be used to form the dielectric multilayer film 25, and MN (index of refraction 2.18), $Nb_2O_3$ (index of refraction 2.4), $Ta_2O_3$ (index of refraction 2.35) or the like may be used, for example. The metal electrode 26 covers the dielectric multilayer film 25 and is formed of a metal material such as Al, for example. The metal electrode 26 is electrically connected to the diffusion electrode 24 through a via-hole 25c formed in the dielectric multilayer film 25.

In this LED element 1, the p-side electrode 27 and the n-side electrode 28 form a reflecting part. Reflectivity of the p-side electrode 27 and the n-side electrode 28 increases as the angle comes closer to the vertical angle. Light that is reflected from the diffractive surface 2a of the sapphire substrate 2 and changes its angle so as to be directed closer to the direction vertical to the interface, as well as light emitted from the light-emitting layer 14 and incident directly on the reflecting part is incident on the reflecting part. That is, the intensity distribution of light incident on the reflecting part is in a state of being inclined closer to the vertical direction as compared to the case where the front surface of the sapphire substrate 2 is planar.

Figure 7:
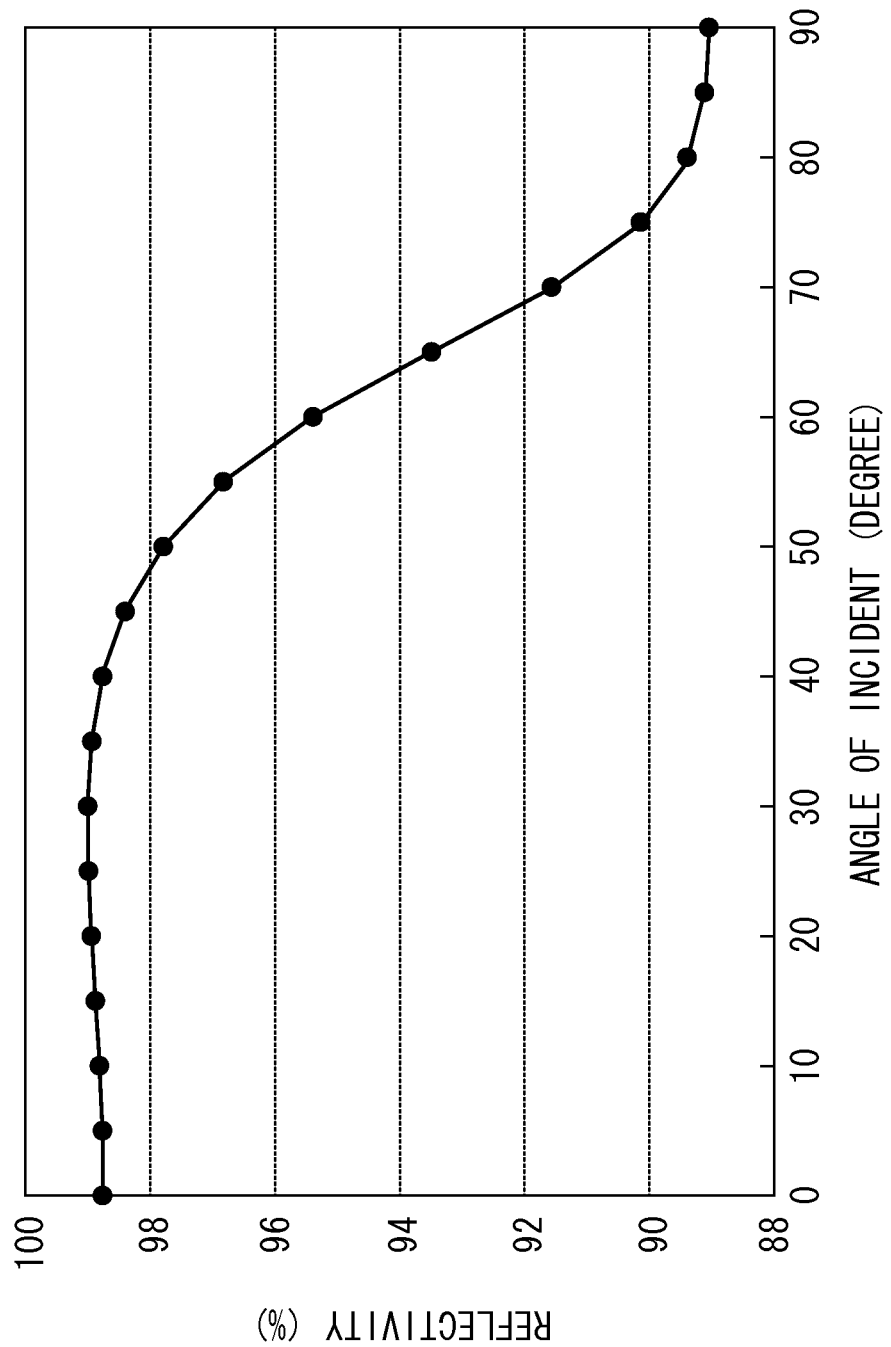
FIG. 7 is a graph illustrating an example of the reflectivity of a reflecting part.

FIG. 7 is a graph illustrating the reflectivity of the reflecting part. In the example of FIG. 7, five pairs of $ZrO_2$ and $SiO_2$ were combined to form the dielectric multilayer film on ITO, and an Al layer was formed to overlap the dielectric multilayer film. As illustrated in FIG. 7, the reflectivity of 98% or more was realized in the angle region where the angle of incidence is between 0° and 45°. Further, the reflectivity of 90% or more was realized in the angle region where the angle of incidence is between 0° and 75°. Thus, the combination of the dielectric multilayer film and the metal layer attains a favorable reflection condition for the light that is directed closer to the vertical direction with respect to the interface. When an Al layer only was formed on ITO, approximately constant reflectivity of 84% was obtained regardless of the angle of incidence.

Next, the sapphire substrate 2 will be described in detail with reference to FIG. 8. FIG. 8 illustrates the sapphire substrate, in which (a) is a schematic perspective view and (b) is a schematic explanatory view taken along with the A-A line.

As illustrated in FIG. 8(a), the diffractive surfaces 2a are formed so as to be aligned at the intersections of virtual triangular lattices with a predetermined period so that the centers of the respective projections 2c are positioned at the vertices of regular triangles in a plan view thereof. It should be noted that the period means the distance between the peak height positions of the adjacent projections 2c. In the present embodiment, the period of the projections 2c is set so as to satisfy the following relation, $$1/2 \times \lambda \le P \le 16/9 \times \lambda$$

where the period of the projections 2c is P and the peak wavelength of the light emitted from the light-emitting layer 14 is λ.

Preferably, the period satisfies the following relation.

$$23/45 \times \lambda \le P \le 14/9 \times \lambda$$

Moreover, the period of the projections 2c is set such that transmitted diffraction light includes at least second-order diffraction light and does not include fifth-order diffraction light. Moreover, the period of the projections 2c is set such that reflected diffraction light includes at least third-order diffraction light.

Here, the light distribution characteristics of light extracted from the LED element 1 will be described with reference to FIGS. 9 to 14. FIG. 9 illustrates the light distribution characteristics of a LED element in polar coordinates, in which (a) illustrates a state in which projections are not formed on the sapphire substrate and (b) to (h) illustrate a state in which projections are formed on the sapphire substrate. Here, (b) illustrates a case where the period is 200 nm, (c) illustrates a case where the period is 225 nm, (d) illustrates a case where the period is 320 nm, (e) illustrates a case where the period is 450 nm, (f) illustrates a case where the period is 600 nm, (g) illustrates a case where the period is 700 nm, and (h) illustrates a case where the period is 800 nm. When the light distribution characteristics are acquired, simulation was performed under conditions that the emission wavelength of the light-emitting layer 14 was 450 nm, the thickness of the semiconductor laminated part 19 was 3.3 μm, and the thickness of the sapphire substrate 2 was 120 μm. In the respective diagrams of FIG. 9, the direction vertical to the sapphire substrate is depicted as 0° (optical axis).

Here, in order to check whether the calculation values and the like obtained by simulation are appropriate, the calculation values obtained by simulation and the measurement values of a sample were compared and examined. This examination was performed by comparing the integrated intensity calculated by simulation with the measurement value obtained by allowing a sample to emit light. FIG. 10 is a table illustrating the calculation value and the measurement value of each substrate. In FIG. 10, "FSS" indicates a substrate on which a projection-and-depression structure is not formed, "PSS" indicates a substrate on which a linear projection-and-depression structure is formed, and "MPSS" indicates a substrate on which depressions or projections that scatter as in the present embodiment are formed. As illustrated in FIG. 10, the calculation value of any substrate is substantially the same as the measurement value, and it is understood that the calculation values or the like of simulation are appropriate.

The light distribution characteristics of FIG. 9 will be examined. As illustrated in FIG. 9(a), when the projections 2c are not formed on the front surface of the sapphire substrate 2, light is isotropically emitted from the LED element 1. In contrast, as illustrated in FIGS. 9(b) to 9(h), when the projections 2c with which the diffraction effect can be obtained are formed, the light distribution characteristics change. Specifically, as illustrated in FIGS. 9(b), 9(c), and other drawings, a position A at which the intensity increases as compared to the other positions is present in a specific angle region of the light distribution characteristics. It is found by inventors that this position A results from ±1st-order light that has transmitted through a diffractive surface after being reflected from a reflecting part. As illustrated in FIGS. 9(b) to 9(h), the angle region of the position A changes when the period of the projections 2c changes.

Figure 11:
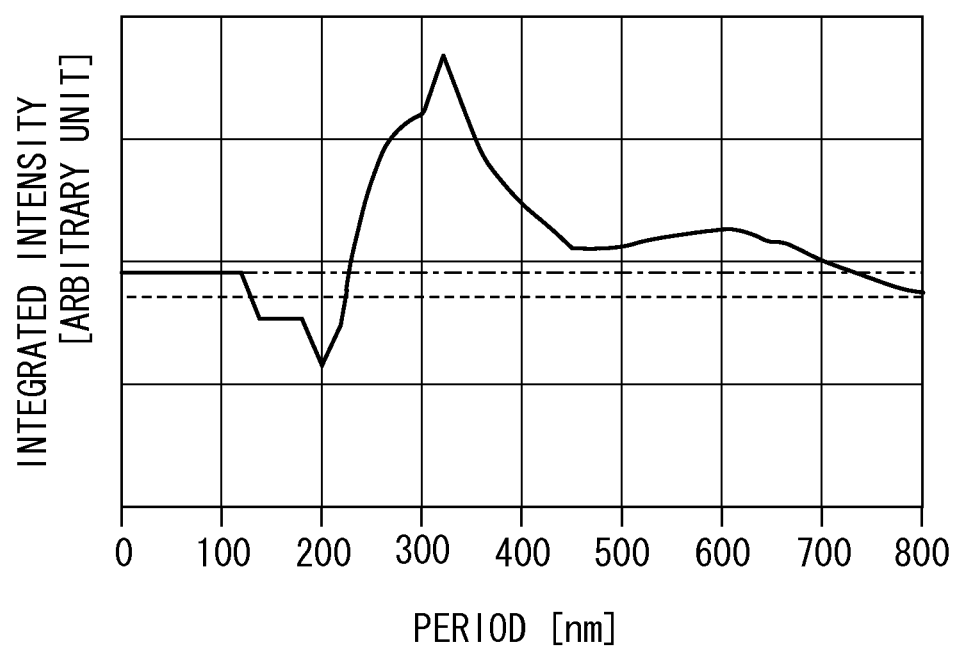
FIG. 11 is a graph illustrating a change in integrated intensity of light within a predetermined angle region with respect to an optical axis.

FIG. 11 is a graph illustrating a change in the integrated intensity of light within a predetermined angle region with respect to the optical axis. In FIG. 11, the horizontal axis represents the period of projections and the vertical axis represents the integrated intensity within ±30° with respect to the optical axis. Here, the broken line indicates the integrated intensity of a PSS substrate in which the period of linear projections is 3 μm. Moreover, the one-dot-chain line indicates the integrated intensity of an FSS substrate.

As illustrated in FIG. 11, the integrated intensity is larger than that of the PSS substrate when the period of the projections 2c is between 225 nm and 800 nm. That is, the light intensity on the optical axis can be made larger than that of the PSS substrate when the following relation is satisfied.

$$1/2 \times \lambda \leq P \leq 16/9 \times \lambda$$

where the period of the projections 2c is P and the peak wavelength of the light emitted from the light-emitting layer 14 is $\lambda$.

Moreover, as illustrated in FIG. 11, the integrated intensity is larger than that of the FSS substrate when the period of the projections 2c is between 230 nm and 700 nm. That is, the light intensity on the optical axis can be made larger than that of the FSS substrate when the following relation is satisfied.

$$23/45 \times \lambda \leq P \leq 14/9 \times \lambda$$

where the period of the projections 2c is P and the peak wavelength of the light emitted from the light-emitting layer 14 is $\lambda$.

FIG. 12 is a graph illustrating the relation between the allowable order and the integrated intensity of transmitted diffraction light. Here, the allowable order indicates the order of the components included in (allowed for) transmitted diffraction light. The one-dot-chain line in FIG. 12 indicates the integrated intensity of the FSS substrate.

As illustrated in FIG. 12, the integrated intensity is always larger than that of the FSS substrate when second, third, or fourth-order components are allowed for transmitted diffraction light, whereas the integrated intensity is lower than that of the FSS substrate when only the first-order components are allowed for the transmitted diffraction light and the fifth or higher-order components are allowed. That is, it is preferable to design such that transmitted diffraction light includes at least second-order diffraction light and does not include fifth-order diffraction light.

Figure 13:
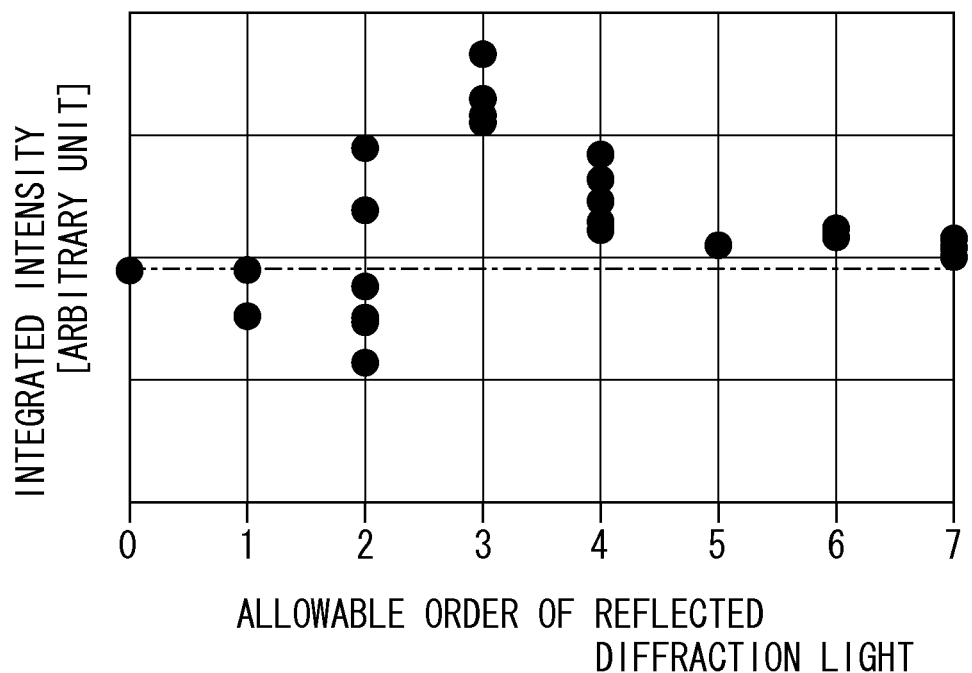
FIG. 13 is a graph illustrating the relation between the allowable order and the integrated intensity of reflected diffraction light.

FIG. 13 is a graph illustrating the relation between the allowable order and the integrated intensity of reflected diffraction light. Here, the allowable order indicates the order of the components included in (allowed for) reflected diffraction light. The one-dot-chain line in FIG. 13 indicates the integrated intensity of the FSS substrate.

As illustrated in FIG. 13, the integrated intensity is always larger than that of the FSS substrate when third or higher-order components are allowed for reflected diffraction light, whereas the integrated intensity is lower than that of the FSS substrate when only the second or lower-order components are allowed for the reflected diffraction light. That is, it is preferable to design such that reflected diffraction light includes at least third-order diffraction light.

Figure 14:
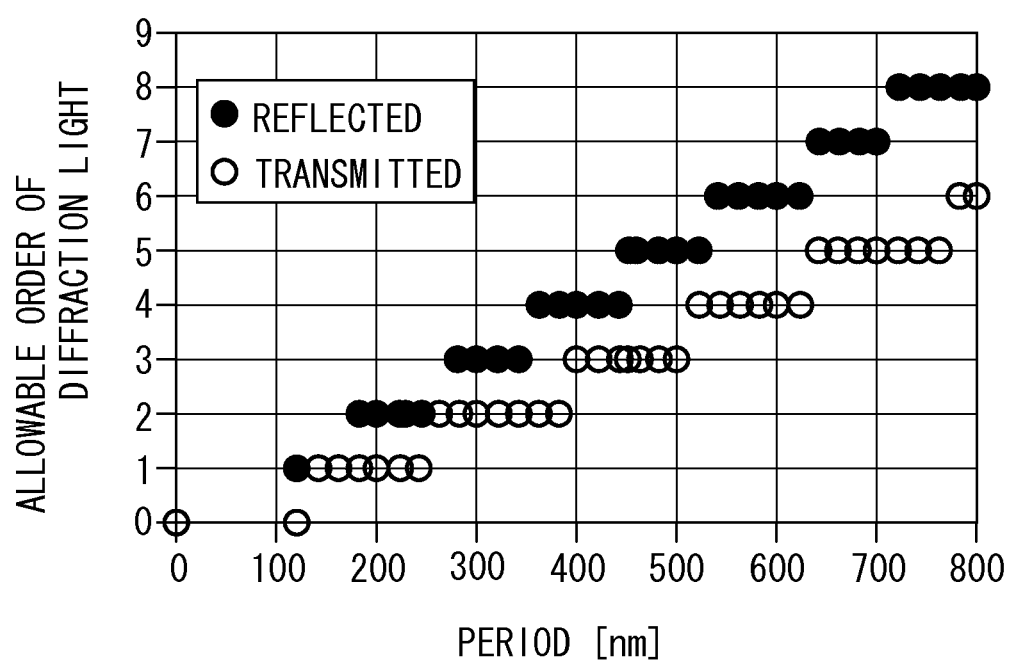
FIG. 14 is a graph illustrating the relation between the period of projections and the allowable orders of transmitted diffraction light and reflected diffraction light.

FIG. 14 is a graph illustrating the relation between the period of projections and the allowable orders of transmitted diffraction light and reflected diffraction light. In FIG. 14, the emission wavelength of the light-emitting layer 14 is 450 nm.

As illustrated in FIG. 14, the period of the projections 2c allowed up to the second, third, or fourth order of the transmitted diffraction light is between 260 nm and 620 nm. That is, the allowable order of the transmitted diffraction light is between the second order and the fourth order when the following relation is satisfied.

$$26/45 \times \lambda \leq P \leq 62/45 \times \lambda$$

where the period of the projections 2c is P and the peak wavelength of the light emitted from the light-emitting layer 14 is $\lambda$.

On the other hand, the period of the projections 2c allowed up to the third or higher order of the reflected diffraction light is 280 nm. That is, the allowable order of the reflected diffraction light is the third or higher order when the following relation is satisfied.

$$28/45 \times \lambda \leq P$$

where the period of the projections 2c is P and the peak wavelength of the light emitted from the light-emitting layer 14 is $\lambda$.

That is, in order to set the allowable order of the transmitted diffraction light to be between the second order and the fourth order and to set the allowable order of the reflected diffraction light to be the third or higher order, the following relation may be satisfied.

$$26/45 \times \lambda \leq P \leq 62/45 \times \lambda$$

In the LED element 1 having such a configuration, since the diffractive surface 2a and the reflecting part are provided, the light distribution characteristics of light emitted from the element can be changed so as to be directed closer to the vertical direction. The light intensity around the optical axis, extracted from the element can be increased, since the following relation is satisfied.

$$1/2 \times \lambda \leq P \leq 16/9 \times \lambda$$

where the period of the projections 2c is P and the peak wavelength of the light emitted from the light-emitting layer 14 is $\lambda$.

Thus, it is possible to realize appropriate light distribution using the light distribution characteristics resulting from diffraction while improving the light extraction efficiency using the diffraction effect.

Moreover, since the diffractive surface 2a is configured such that the second, third, or fourth order is allowed for transmitted diffraction light and the third or higher order is allowed from reflected diffraction light, it is possible to increase the light intensity around the optical axis, extracted from the element.

Moreover, due to the light verticalization effect in the diffractive surface 2a, the distance travelled by the light emitted from the light-emitting layer 14 until reaching the back surface of the sapphire substrate 2 can be reduced remarkably, and the absorption of light in the element can be suppressed. LED elements have such a problem that light is absorbed in the element since light in the angle region exceeding the critical angle of the interface propagates in a lateral direction. However, since light in the angle region exceeding the critical angle is directed closer toward the vertical direction in the diffractive surface 2a, the light absorbed in the element can be reduced dramatically. Further, in the present embodiment, the reflecting part is formed of a combination of the dielectric multilayer films 22 and 25 and the metal layers 23 and 26 so that the reflectivity increases as the angle comes closer to the vertical angle with respect to the interface while maintaining high reflectivity in a relatively wide angle region, which attains a favorable reflection condition for the light that is directed closer toward the vertical direction with respect to the interface. Even when the reflecting part is formed of the dielectric multilayer films 22 and 25 only, since the reflectivity increases as the angle comes closer to the vertical angle with respect to the interface, it can be said that a favorable reflection condition for the light that is directed closer toward the vertical with respect to the interface is obtained.

Figure 15:
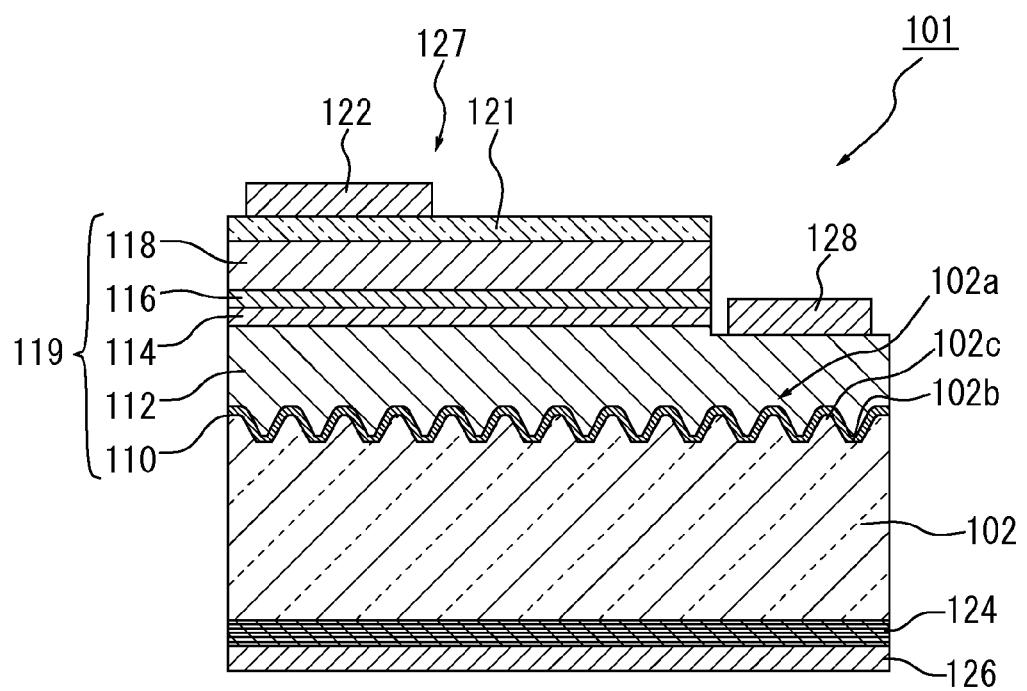
FIG. 15 is a schematic sectional view of an LED element according to a second embodiment of the present invention.

FIGS. 15 and 16 illustrate a second embodiment of the present invention, and FIG. 15 is a schematic sectional view of an LED element.

As illustrated in FIG. 15, an LED element 101 is a face-up type LED element in which a semiconductor laminated part 119 formed of a group-III nitride semiconductor layer is formed on a front surface of a sapphire substrate 102. This LED element 101 is a face-up type LED element, and light is mainly extracted from the side opposite to the sapphire substrate 102. The semiconductor laminated part 119 has a buffer layer 110, an n-type GaN layer 112, a light-emitting layer 114, an electron blocking layer 116, and a p-type GaN layer 118 in that order from the side of the sapphire substrate 102. A p-side electrode 127 is formed on the p-type GaN layer 118, and an n-side electrode 128 is formed on the n-type GaN layer 112. The p-side electrode 127 includes a diffusion electrode 121 that is formed on the p-type GaN layer 118 and a pad electrode 122 that is formed on a part of the diffusion electrode 121.

In the LED element 101, the front surface of the sapphire substrate 102 forms a diffractive surface 102a. A planar part 102b and the plurality of projections 102c that are periodically formed on the planar part 102b are formed on the front surface of the sapphire substrate 102. Examples of the shape of each projection 102c include a pyramidal shape such as a conical shape or a polygonal pyramidal shape and a truncated pyramidal shape obtained by cutting the top of a pyramid such as a truncated conical shape or a truncated polygonal pyramidal shape. Each projection 102c is designed to diffract light emitted from the light-emitting layer 114. In the present embodiment, the light verticalizing effect can be obtained by the projections 102c disposed periodically.

In the diffractive surface 102a of the present embodiment, the period of the projections 102c is set so as to satisfy the following relation.

$$1/2 \times \lambda \leq P \leq 16/9 \times \lambda$$

where the period of the projections 102c is P and the peak wavelength of the light emitted from the light-emitting layer 114 is λ.

Moreover, the period of the projections 2c is set such that transmitted diffraction light includes at least second-order diffraction light and does not include fifth-order diffraction light. Moreover, the period of the projections 2c is set such that reflected diffraction light includes at least third-order diffraction light.

FIG. 16 is a partially enlarged schematic sectional view of the LED element.

As illustrated in FIG. 16, a dielectric multilayer film 124 is formed on the back surface of the sapphire substrate 102. The dielectric multilayer film 124 is covered by an Al layer 126 which is a metal layer. In this light-emitting element 101, the dielectric multilayer film 124 and the Al layer 126 form a reflecting part, and light emitted from the light-emitting layer 114 and transmitted through the diffractive surface 102a by the diffraction effect is reflected from the reflecting part. The light transmitted by the diffraction effect is incident on the diffractive surface 102a again and is transmitted through the diffractive surface 102a again by the diffraction effect, whereby the light can be extracted outside the element in a plurality of modes.

Figure 17:
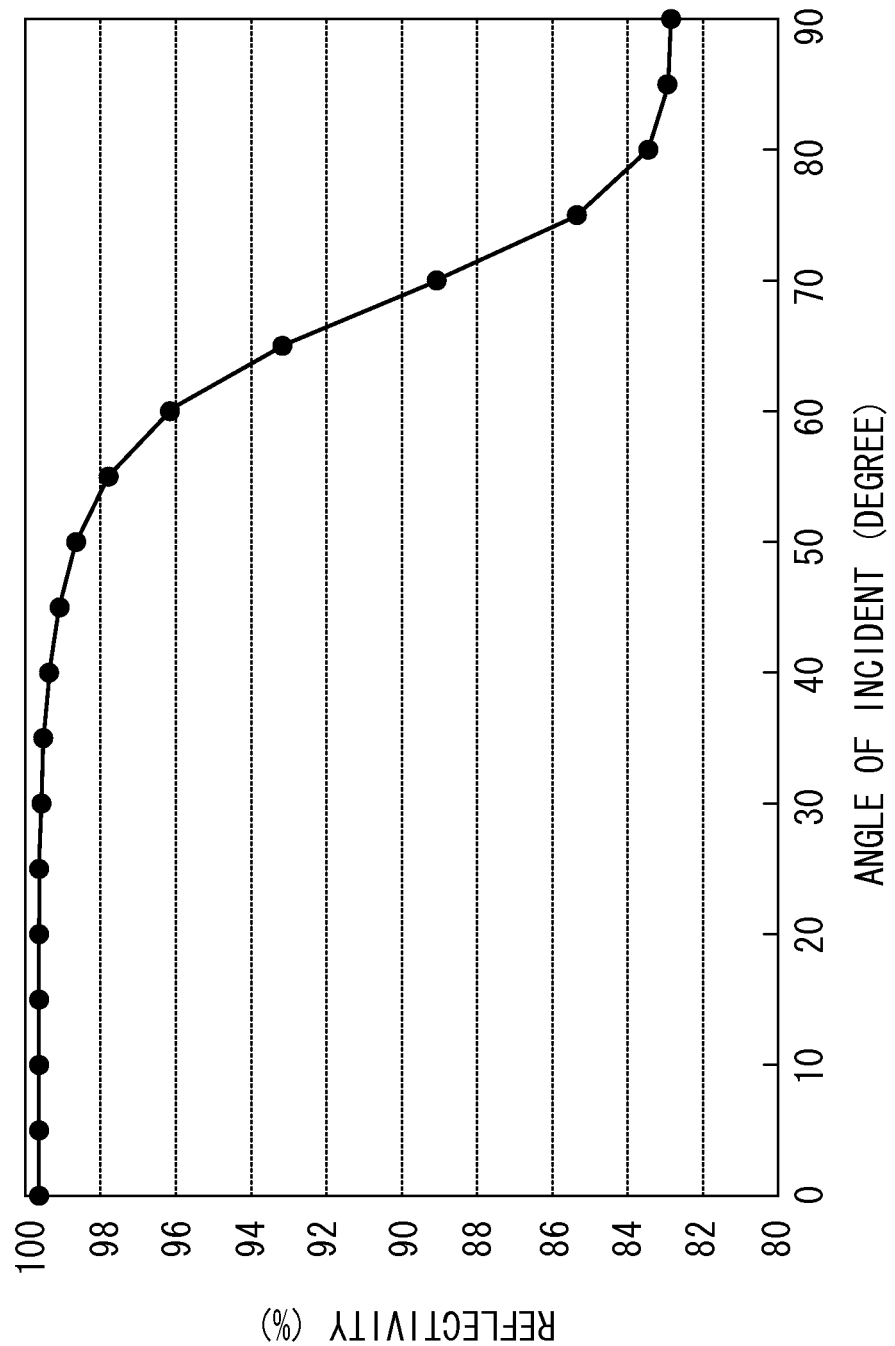
FIG. 17 is a graph illustrating an example of the reflectivity of a reflecting part.

FIG. 17 is a graph illustrating an example of the reflectivity of a reflecting part. In FIG. 17, five pairs of $ZrO_2$ and $SiO_2$ were combined to form the dielectric multilayer film on the sapphire substrate, and an Al layer was formed to overlap the dielectric multilayer film. As illustrated in FIG. 17, the reflectivity of 99% or more was realized in the angle region where the angle of incidence is between 0° and 55°. Further, the reflectivity of 98% or more was realized in the angle region where the angle of incidence is between 0° and 60°. Further, the reflectivity of 92% or more was realized in the angle region where the angle of incidence is between 0° and 75°. Thus, the combination of the dielectric multilayer film and the metal layer attains a favorable reflection condition for the light that is directed closer toward the vertical direction with respect to the interface. When an Al layer only was formed on the sapphire substrate, approximately constant reflectivity of 88% was obtained regardless of the angle of incidence.

In the LED element 101 having the above-described configuration, since the diffractive surface 102a and the reflecting part are provided, the light distribution characteristics of light emitted from the element can be changed so as to be directed closer to the vertical direction. The light intensity around the optical axis, extracted from the element can be increased, since the following relation is satisfied.

$$1/2 \times \lambda \leq P \leq 16/9 \times \lambda$$

where the period of the projections 102c is P and the peak wavelength of the light emitted from the light-emitting layer 114 is λ.

Moreover, since the diffractive surface 102a is configured such that the second, third, or fourth order is allowed for transmitted diffraction light and the third or higher order is allowed from reflected diffraction light, it is possible to increase the light intensity around the optical axis, extracted from the element.

Further, the distance travelled by the light emitted from the light-emitting layer 114 until reaching the front surface of the p-side electrode 127 can be reduced remarkably, and the absorption of light in the element can be suppressed. LED elements have such a problem that light is absorbed in the element since light in the angle region exceeding the critical angle of the interface propagates in a lateral direction. However, since light in the angle region exceeding the critical angle is directed closer toward the vertical direction in the diffractive surface 102a, the light absorbed in the element can be reduced dramatically. Further, in the present embodiment, the reflecting part is formed of a combination of the dielectric multilayer film 124 and the metal layer 126 so that the reflectivity increases as the angle comes closer to the direction verticle with respect to the interface, which attains a favorable reflection condition for the light that is directed toward the vertical direction with respect to the interface.

According to the first and second embodiments, although a configuration in which the diffractive surface is formed by the projections formed periodically has been illustrated, the diffractive surface may of course be configured by the depressions formed periodically as well. Moreover, the projections or the depressions may be formed so as to be aligned at the intersections of virtual square lattices, for example, instead of forming the same at the intersections of the triangular lattices.

Figure 18:
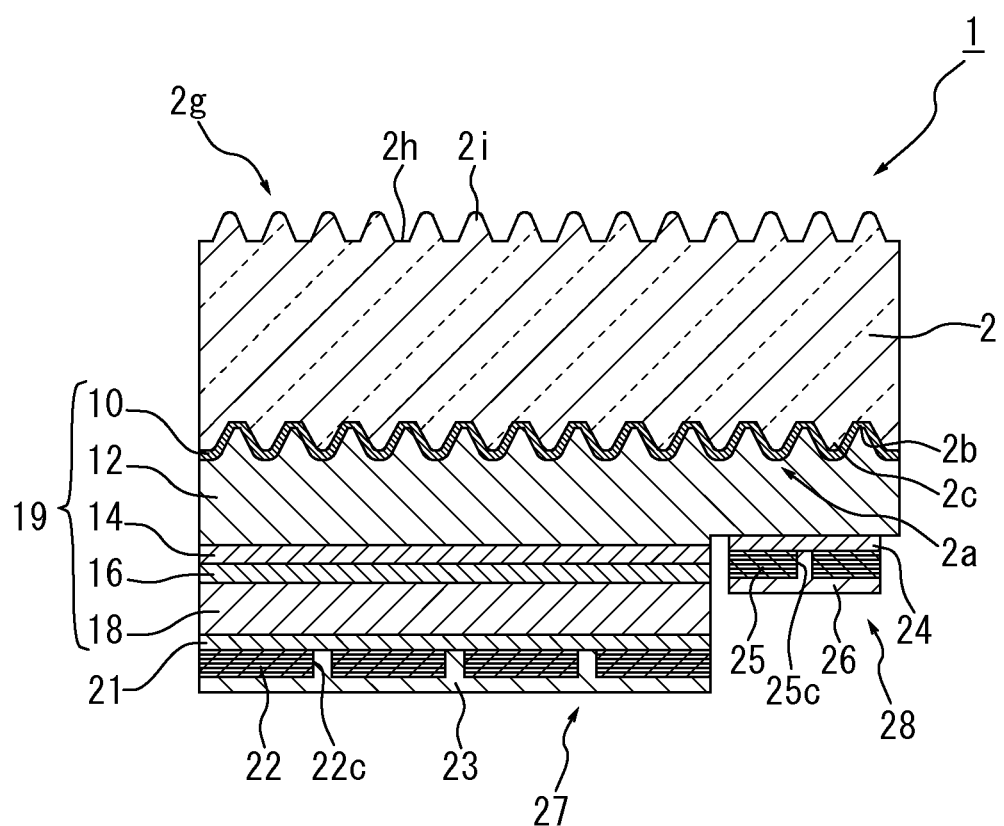
FIG. 18 is a schematic sectional view of a LED element according to a modified example.
Figure 19:
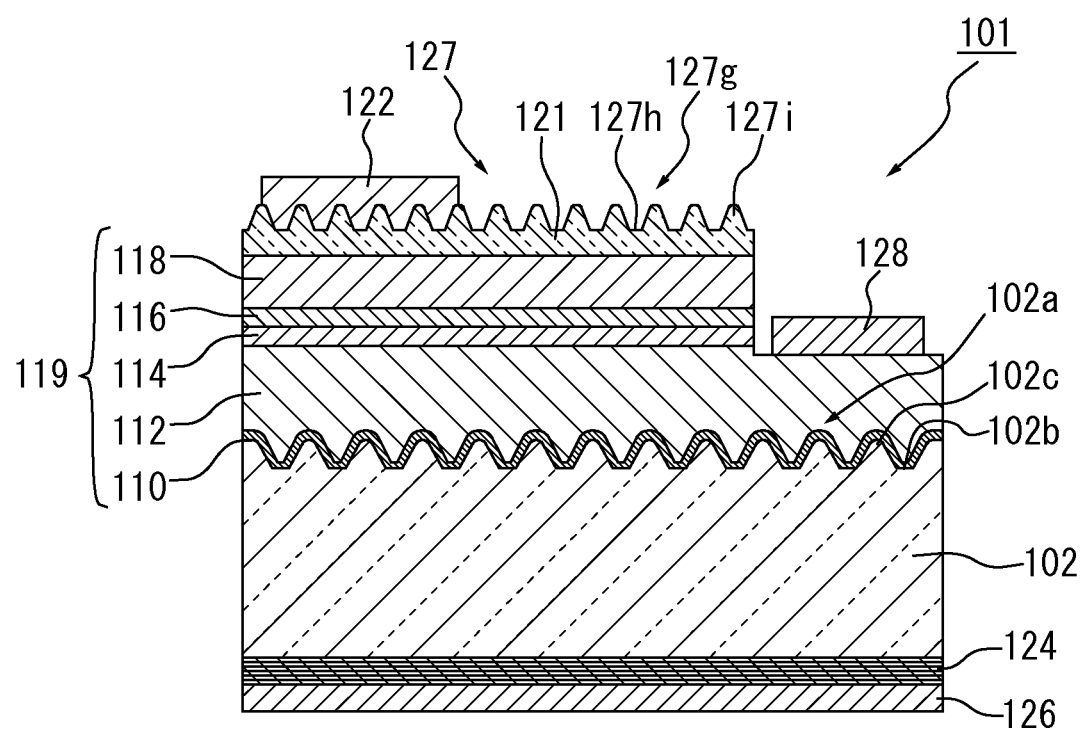
FIG. 19 is a schematic sectional view of a LED element according to a modified example.

In the first and second embodiments, although the light emission surface of the element is planar, a projection-and-depression structure may be formed on the light emission surface as illustrated in FIGS. 18 and 19, for example. An LED element 1 illustrated in FIG. 18 is a flip-chip type LED element of the first embodiment, in which a projection-and-depression structure is formed on the back surface of the sapphire substrate 2. A planar part 2h and a plurality of projections 2i that are periodically formed on the planar part 2h are formed on a back surface 2g of the sapphire substrate 2. Examples of the shape of each projection 2i include a pyramidal shape such as a conical shape or a polygonal pyramidal shape and a truncated pyramidal shape obtained by cutting the top of a pyramid such as a truncated conical shape or a truncated polygonal pyramidal shape. The period of the projections 2i on the back surface 2g of the sapphire substrate 2 is preferably smaller than the period of the diffractive surfaces 2a. By doing so, Fresnel reflection in the back surface 2g of the sapphire substrate 2 is suppressed.

Moreover, an LED element 101 illustrated in FIG. 19 is a face-up type LED element of the second embodiment in which a projection-and-depression structure is formed on the front surface of the p-side electrode 127. A planar part 127h and a plurality of projections 127i that are periodically formed on the planar part 127h are formed on the front surface 127g of the p-side electrode 127. Examples of the shape of each projection 127i include a pyramidal shape such as a conical shape or a polygonal pyramidal shape and a truncated pyramidal shape obtained by cutting the top of a pyramid such as a truncated conical shape or a truncated polygonal pyramidal shape. The period of the projections 127i on the front surface 127g of the p-side electrode 127 is preferably smaller than the period of the diffractive surfaces 102a. By doing so, Fresnel reflection in the front surface 127g of the p-side electrode 127 is suppressed.

Moreover, in the first and second embodiments, although blue light is emitted from the light-emitting layer, light of the color such as, for example, green or red may be emitted from the light-emitting layer. In this case, the relation between the period of depressions or projections and the peak wavelength of the light emitted from the light-emitting layer may satisfy a predetermined condition.

INDUSTRIAL APPLICABILITY

As described above, the LED element according to the present invention is industrially useful because the LED element can realize appropriate light distribution using the light distribution characteristics resulting from diffraction while improving the light extraction efficiency using the diffraction effect.

REFERENCE SIGNS LIST

1 LED element
2 Sapphire substrate
2a Diffractive surface
2c Projection
14 Light-emitting layer
19 Semiconductor laminated part
27 p-side electrode
28 n-side electrode
101 LED element
102 Sapphire substrate
102a Diffractive surface
114 Light-emitting layer
119 Semiconductor laminated part
124 Dielectric multilayer film
126 Al layer

The invention claimed is:

1. An LED element comprising:
a sapphire substrate in which periodic depressions or projections are formed on a front surface and the front surface forms a diffractive surface;
a semiconductor laminated part that is formed on the front surface of the sapphire substrate, includes a light-emitting layer, and is formed of a group-III nitride semiconductor; and
a reflecting part that reflects at least a part of light emitted from the light-emitting layer toward the front surface of the sapphire substrate, wherein
a diffraction effect of light emitted from the light-emitting layer is obtained at an interface between the sapphire substrate and the semiconductor laminated part,
an intensity distribution of the light transmitting through and extracted from the diffractive surface on a side of the sapphire substrate is inclined closer to a direction vertical to the interface between the semiconductor laminated part and the sapphire substrate than an intensity distribution of the light incident on the diffractive surface on a side of the semiconductor laminated part,
a relation of $1/2 \times \lambda \leq P \leq 16/9 \times \lambda$ is satisfied, where a period of the depressions or the projections is P and a peak wavelength of the light emitted from the light-emitting layer is $\lambda$,
the reflecting part is formed of a laminated structure of a dielectric multilayer film and a metal layer, and the reflectivity of the reflecting part increases as an angle comes closer to the direction vertical to the interface, and
wherein a period of the depressions or the projections is set such that transmitted diffraction light of the light at the interface does not include fifth or higher-order diffraction light.

2. The LED element according to claim 1, wherein a relation of $1/2 \times \lambda \leq P \leq \lambda$ is satisfied, where a period of the depressions or the projections is P and a peak wavelength of the light emitted from the light-emitting layer is $\lambda$.

3. The LED element according to claim 1, wherein a relation of $23/45 \times \lambda \leq P \leq \lambda$ is satisfied, where a period of the depressions or the projections is P and a peak wavelength of the light emitted from the light-emitting layer is $\lambda$.

4. The LED element according to claim 1, wherein a period of the depressions or the projections is set such that transmitted diffraction light of the light at the interface includes at least second-order diffraction light.

5. The LED element according to claim 1, wherein a period of the depressions or the projections is set such that reflected diffraction light of the light at the interface includes at least third-order diffraction light.

6. The LED element according to claim 1, wherein periodic depressions or projections of which the period is smaller than that of the diffractive surfaces are formed on a light emission surface of the LED element.

7. The LED element according to claim 1, wherein
the LED element comprises a flip-chip type LED element, and
periodic depressions or projections of which the period is smaller than that of the diffractive surfaces are formed on a back surface of the sapphire substrate.

8. An LED element comprising:
a sapphire substrate in which periodic depressions or projections are formed on a front surface and the front surface forms a diffractive surface;
a semiconductor laminated part that is formed on the front surface of the sapphire substrate, includes a light-emitting layer, and is formed of a group-III nitride semiconductor; and
a reflecting part that reflects at least a part of light emitted from the light-emitting layer toward the front surface of the sapphire substrate, wherein
a diffraction effect of light emitted from the light-emitting layer is obtained at an interface between the sapphire substrate and the semiconductor laminated part,
an intensity distribution of the light transmitting through and extracted from the diffractive surface on a side of the sapphire substrate is inclined closer to a direction vertical to the interface between the semiconductor laminated part and the sapphire substrate than an intensity distribution of the light incident on the diffractive surface on a side of the semiconductor laminated part,
a relation of $1/2 \times \lambda \leq P \leq 16/9 \times \lambda$ is satisfied, where a period of the depressions or the projections is P and a peak wavelength of the light emitted from the light-emitting layer is $\lambda$,
the reflectivity of the reflecting part increases as an angle comes closer to the direction vertical to the interface, and
wherein a period of the depressions or the projections is set such that transmitted diffraction light of the light at the interface does not include fifth or higher-order diffraction light.

9. An LED element comprising:
a sapphire substrate in which periodic depressions or projections are formed on a front surface and the front surface forms a diffractive surface;
a semiconductor laminated part that is formed on the front surface of the sapphire substrate, includes a light-emitting layer, and is formed of a group-III nitride semiconductor; and
a reflecting part that reflects at least a part of light emitted from the light-emitting layer toward the front surface of the sapphire substrate, wherein
a diffraction effect of light emitted from the light-emitting layer is obtained at an interface between the sapphire substrate and the semiconductor laminated part,
a relation of $1/2 \times \lambda \leq P \leq 16/9 \times \lambda$ is satisfied, where a period of the depressions or the projections is P and a peak wavelength of the light emitted from the light-emitting layer is $\lambda$,
the reflecting part is formed of a laminated structure of a dielectric multilayer film and a metal layer, and
wherein a period of the depressions or the projections is set such that transmitted diffraction light of the light at the interface does not include fifth or higher-order diffraction light.

10. The LED element according to claim 1, wherein the light incident on the sapphire substrate at an angle exceeding a critical angle among the light emitted is transmitted through and reflected from the diffractive surface so as to be subsequently directed closer to the vertical direction than when the light is incident on the diffractive surface.

11. The LED element according to claim 1, wherein the light having transmitted through the diffractive surface is incident on a back surface of the sapphire substrate in a state where an angle of the light is changed so as to be subsequently directed closer to the vertical direction.

12. The LED element according to claim 1, wherein the light having been reflected from the diffractive surface is incident on the diffractive surface again after being reflected from a p-side electrode and an n-side electrode in a state where an angle of the light is changed so as to be subsequently directed closer to the vertical direction.

13. The LED element according to claim 1, wherein the diffractive surface is formed so as to be aligned at an intersection of virtual triangular lattices with a predetermined period so that centers of the respective projections are positioned at the vertices of regular triangles in a plan view thereof.

* * * * *